(12) United States Patent
Cesaretti et al.

(10) Patent No.: US 11,402,280 B2
(45) Date of Patent: Aug. 2, 2022

(54) MAGNETIC SENSOR WITH IMPROVED STRESS COMPENSATION ACCOUNTING FOR TEMPERATURE

(71) Applicant: Allegro MicroSystems, LLC, Manchester, NH (US)

(72) Inventors: Juan Manuel Cesaretti, Ciudad de Buenos Aires (AR); Evan Shorman, Manchester, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 514 days.

(21) Appl. No.: 16/538,270

(22) Filed: Aug. 12, 2019

(65) Prior Publication Data

US 2021/0048353 A1 Feb. 18, 2021

(51) Int. Cl.
*G01L 1/12* (2006.01)
*G01R 33/00* (2006.01)
*G01R 33/09* (2006.01)
*G01R 33/07* (2006.01)

(52) U.S. Cl.
CPC .............. *G01L 1/12* (2013.01); *G01R 33/007* (2013.01); *G01R 33/072* (2013.01); *G01R 33/09* (2013.01)

(58) Field of Classification Search
None
See application file for complete search history.

(56) References Cited

U.S. PATENT DOCUMENTS

| 7,923,996 B2 * | 4/2011 | Doogue | G01R 33/0041 |
| | | | 324/252 |
| 8,350,563 B2 * | 1/2013 | Haas | G01R 33/02 |
| | | | 324/225 |

(Continued)

OTHER PUBLICATIONS

Huber, et al.; "A Fully Integrated Analog Compensation for the Piezo-Hall Effect in a CMOS Single-Chip Hall Sensor Microsystem"; IEEE Sensors Journal; vol. 15; No. 5; May 2015; 10 Pages.

(Continued)

*Primary Examiner* — Lisa M Caputo
*Assistant Examiner* — Nigel H Plumb
(74) *Attorney, Agent, or Firm* — Daly, Crowley, Mofford & Durkee, LLP

(57) ABSTRACT

A magnetic field sensor is provided with improved stress compensation accounting for temperature. The magnetic field sensor includes a stress sensing, element, a temperature sensing element, a magnetic field sensing element, a memory, and an electronic circuitry. The memory is configured to store a first table. The first table identifies a plurality of stress-to-sensitivity coefficients. Each of the plurality of stress-to-sensitivity coefficients is mapped to a different temperature value. The electronic circuitry is configured to use a temperature reading and a stress reading to calculate a stress difference between an expected stress and the stress reading. The electronic circuitry is further configured to obtain a stress-to-sensitivity coefficient that corresponds to the temperature reading by using the first table, calculate a gain adjustment coefficient based an the stress-to-sensitivity coefficient, and adjust a gain of a signal that is generated by the magnetic field sensing element based on the grain adjustment coefficient.

20 Claims, 9 Drawing Sheets

(56) References Cited

U.S. PATENT DOCUMENTS

| | | | | |
|---|---|---|---|---|
| 8,447,556 B2* | 5/2013 | Friedrich | ............. | G01R 35/005 |
| | | | | 702/183 |
| 8,542,010 B2* | 9/2013 | Cesaretti | .............. | G01R 35/005 |
| | | | | 324/202 |
| 8,680,846 B2* | 3/2014 | Cesaretti | ............ | G01R 33/0035 |
| | | | | 702/183 |
| 9,638,764 B2* | 5/2017 | Cesaretti | ............. | G01R 33/075 |
| 10,107,873 B2* | 10/2018 | Cesaretti | ................ | H01L 28/20 |
| 10,162,017 B2* | 12/2018 | Cesaretti | ................ | G01R 33/07 |
| 2019/0049529 A1* | 2/2019 | Cesaretti | ............. | G01R 33/077 |

OTHER PUBLICATIONS

Huber, et al.; "Package Stress Monitor to Compensate for the Piezo-Hall Effect in CMOS Hall Sensors"; IEEE Sensors Journal; vol. 13; Issue 8; Aug. 2013; 4 Pages.

* cited by examiner

MAGNETIC SENSOR WITH IMPROVED STRESS COMPENSATION ACCOUNTING FOR TEMPERATURE

BACKGROUND

Hall effect elements are known. A typical planar or horizontal Hall effect element is a four terminal device for which a drive current (a DC current) is passed between two opposing ones of the four terminals and a differential voltage (AC or DC), responsive to a magnetic field (AC or DC), is generated between the other two opposing ones of the four terminals. An amplitude of the differential signal (i.e., voltage) is related an amplitude of the drive current. Thus, a sensitivity (e.g., mV per Gauss) of the differential signal is related to the amplitude of the drive current.

The Hall effect element can be used in current spinning or chopping arrangements in order to reduce a DC offset from the Hall effect element, which is typified by a non-zero output voltage from the Hall effect element even when experiencing a zero magnetic field. With current spinning or chopping, the terminals used to pass the drive current and the terminals used to generate the differential signal can be changed at a current spinning rate in a periodic and cyclic manner. There can be two such changes per cycle with two-phase current spinning or four such changes with four-phase current spinning.

In order to maintain a constant and stable sensitivity, the drive current can be generated with a stable current source or a current sink that uses a stable reference voltage. However, various parameters can cause the sensitivity to magnetic fields of the differential signal to change.

In general, even with a perfectly stable drive current, the Hall effect element itself can experience sensitivity changes. The changes in sensitivity of the Hall effect element can result directly from temperature changes. In order to correct for this sensitivity change, temperature can be sensed and the changes in sensitivity with temperature can be corrected.

However, the changes in sensitivity of the differential signal can also result from stresses upon a substrate on which the Hall effect element is disposed. The stresses may or may not be related to temperature and also may or may not be related to a thermal coefficient of a material of a package used to seal the substrate. The stresses and resulting changes in sensitivity may vary from unit to unit in different ways with respect to temperature.

SUMMARY

According to aspects of the disclosure, a magnetic field sensor is provided, comprising: a stress sensing element; a temperature sensing element; a magnetic field sensing element that is arranged to generate a sensing element signal; a memory configured to store a first table, the first table identifying a plurality of stress-to-sensitivity coefficients, each of the plurality of stress-to-sensitivity coefficients being associated with a different temperature value; and electronic circuitry configured to: obtain a stress reading by using the stress sensing element, obtain a temperature reading by using the temperature sensing element, use the temperature reading and the stress reading to calculate a stress difference, obtain a stress-to-sensitivity coefficient that is associated with the temperature reading by using the first table, calculate a gain adjustment coefficient based on the stress-to-sensitivity coefficient, and adjust a gain of the sensing element signal based on the gain adjustment coefficient, wherein the stress difference includes a difference between an expected stress and the stress reading that is obtained from the stress sensing element.

According to aspects of the disclosure, a method is provided comprising: obtaining a temperature reading by using a temperature sensing element that is part of a magnetic field sensor; obtaining a stress reading by using a stress sensing element that is part of the magnetic field sensor; calculating a stress difference using the temperature reading and the stress reading, the stress difference including a difference between an expected stress associated with the temperature reading and the stress reading obtained from the stress sensing element; and adjusting a gain of a sensing element signal based on the stress difference, the sensing element signal being generated at least in part by a magnetic field sensing element that is part of the magnetic field sensor.

According to aspects of the disclosure a magnetic field sensor is provided, comprising: a temperature sensing element; a stress sensing element; a magnetic field sensing element; and electronic circuitry configured to perform the operations of: obtaining a temperature reading by using the temperature sensing element; obtaining a stress reading by using the stress sensing element; calculating a stress difference using the temperature reading and the stress reading, the stress difference including a difference between an expected stress associated with the temperature reading and the stress reading obtained from the stress sensing element; and adjusting a gain of a sensing element signal based on the stress difference, the sensing element signal being generated by the magnetic field sensing element.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

Figure 1A:
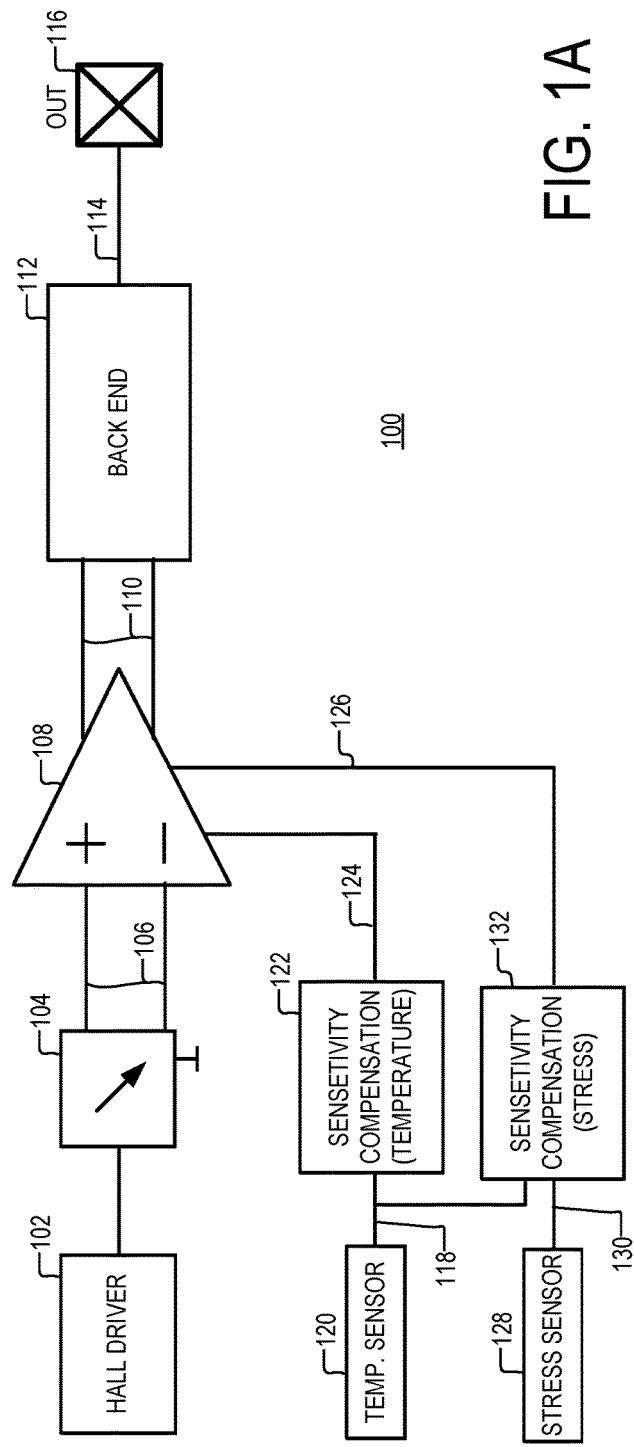
FIG. 1A is a diagram of an example of a magnetic field sensor, according to aspects of the disclosure.

According to aspects of the disclosure, a magnetic field sensor is disclosed that features adaptive stress compensation. More particularly, the magnetic field sensor is provided with an amplifier that is arranged to compensate for Piezo-Hall and Piezo-resistive effects arising from changes in stress within the magnetic field sensor. The gain of the amplifier is adjusted based on: (i) temperature that is measured by an on-die temperature sensor, and (ii) stress that is measured by an on-die stress sensor. As can be readily appreciated, the adjustment that is based on temperature can effectively compensate for stress effects arising from thermal expansion of components of the magnetic field sensor. However, this adjustment may be unable to account for stress effects arising from changes in humidity or other factors. The latter stress effects are compensated by using the on-die stress sensor.

According to aspects of the disclosure, the magnetic field sensor is provided with processing circuitry, which is configured to generate a first gain adjustment signal based on temperature values measured by the temperature sensor. The first gain adjustment signal is used to control the gain of the amplifier to compensate for stresses that are attributable to the temperature of the magnetic field sensor.

According to aspects of the disclosure, the magnetic field sensor is further provided with a memory. The memory is configured to store a table of stress values that are expected to be experienced by the magnetic field sensor at different temperatures. The expected stress values can be determined empirically by exposing a magnetic field sensor to different temperatures and measuring the resulting stress on the sensor. As a result of being measured in a controlled environment (e.g., at a fixed humidity), the expected stress values may not account for stresses that appear in the magnetic field sensor as a result of factors other than temperature (e.g., as a result of changes in humidity).

The expected stress values are used to determine the amount of stress on the magnetic field sensor that is attributable to factors other than temperature. The amount of stress that is attributable to other factors is determined by calculating the difference between: (i) the expected stress for a current temperature of the magnetic field sensor and (ii) the stress value that is measured by the on-die stress sensor at the current temperature. The difference is then used by the processing circuitry to calculate a second gain adjustment signal. And the second gain adjustment signal is subsequently used to supplement the first gain adjustment signal in controlling the gain of the amplifier of the magnetic field sensor.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor.

As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

The terms "parallel" and "perpendicular" may be used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "current generator" is used to describe either a current source or a current sink. It should be understood that a current source has a current output and a current sink has a current input, with a high output or input impedance, respectively.

As used herein, the term "current passing terminal" is used to describe a terminal of an active or passive electronic component that either receives a current or out of which a current comes. Thus, it will be appreciated that both a collector and emitter of a bipolar junction transistor (BJT) are current passing terminals. It will also be appreciated that both a source and a drain of the field effect transistor (FET) are current passing terminals.

As used herein, the term "substrate" is used to describe any type of structure with a flat surface upon which semiconductor materials can be deposited and/or into which semiconductor materials can be implanted and diffused. In some embodiments, the substrate is a P-type silicon substrate having a particular range of concentrations of P-type atoms (i.e., ions)

As used herein, the term "epi" is used to refer to an epitaxial layer, for example, an N-type epitaxial layer, disposed over a substrate, for example, a P-type substrate, and having a particular range of concentrations of N-type atoms (i.e. ions).

As used herein, the term "N+" or "NP" is used to refer to a region implanted and diffused into a semiconductor layer, for example, into a surface of the epitaxial layer furthest from the substrate, and having another particular range of concentrations of N-type atoms (i.e. ions).

As used herein, the term "Light-N" or simply "LN" is used to refer to a region implanted and diffused into a semiconductor layer, for example, into a surface of the epitaxial layer further from the substrate, and having a particular range of concentrations of N-type atoms (i.e. ions).

As used herein, the term "P-well" is used to refer to a region implanted and diffused into a semiconductor layer, for example, into a surface of the epitaxial layer further from the substrate and having a particular range of concentrations of P-type atoms (i.e. ions).

As used herein, the term "P-type buried layer" or simply "PBL" is used to refer to a region implanted and diffused into a semiconductor layer, for example, implanted into the substrate and then upwardly diffused into the epitaxial (epi) layer (also referred to herein as an epi layer). The epi layer can be grown after PBL implant and diffusion steps, and the upward diffusion into epi layer can be performed during a field oxidation process.

As used herein, the term "N-type buried layer" or simply "NBL" is used to refer to a region implanted and diffused into a semiconductor layer, for example, implanted into the substrate and then upwardly diffused into the epitaxial (epi) layer. The epi layer can be grown after NBL implant and diffusion steps, and the upward diffusion into epi layer can be performed during a field oxidation process.

As used herein, the term "P+" or "PP" is used to refer to a region implanted and diffused into a semiconductor layer, for example, into a surface of the epitaxial layer furthest from the substrate, and having another particular range of concentrations of P-type atoms (i.e. ions).

As used herein, the concentrations of the above types of semiconductor structures can fall into the following ranges:

substrate=about $1\times10^{15}$ P-type atoms per cm3, for example, boron atoms.

epi=about $1\times10^{15}$ to about $6\times10^{15}$ N-type atoms per cm3, for example, Arsenic atoms, where: $5\times10^{14}$ to $1\times10^{15}$ can be representative of a concentration of epi bulk doping, and $5\times10^{15}$ to $1\times10^{16}$ can be representative of a concentration at a surface region of the epi layer at about 2 um depth created by an additional epi implant step. (Alternatively, $1\times10^{15}$ to $6\times10^{15}$).

N+=about $1\times10^{20}$ N-type atoms per cm3, for example, phosphorous atoms.

LN=about 1 to $2\times10^{17}$ atoms per cm3, for example, phosphorous atoms.

P-well=about $1\times10^{16}$ P-type atoms per cm3, for example, boron atoms.

PBL=about $1\times10^{18}$ to about $2\times10^{18}$ P-type atoms per cm3, for example, boron atoms.

NBL=about $1\times10^{19}$ to about $1.5\times10^{19}$ N-type atoms per cm3, for example, antimony atoms.

P+=about $3\times10^{19}$ to about $5\times10^{19}$ P-type atoms per cm3, for example, boron atoms.

In some embodiments, the concentrations are outside of the above ranges or values but can be within about +/− twenty percent of the above ranges or values.

It should be noted that reference is sometimes made herein to assemblies having a particular shape (e.g., rectangular or square). One of ordinary skill in the art will appreciate, however, that the techniques described herein are applicable to a variety of sizes and shapes.

FIG. 1A shows an example of a stress-compensated magnetic field sensor 100, according to aspects of the disclosure. The magnetic field sensor 100 includes a voltage regulator 102 that is operatively coupled to a Hall effect element 104. The Hall effect element 104 is arranged to feed a differential signal 106 to a variable gain amplifier 108. The variable gain amplifier 108 is configured to adjust the gain of the differential signal 106 to produce an adjusted differential signal 110. The adjusted differential signal 110 is supplied to a backend element 112, which is configured to feed an output signal 114 to an output terminal 116. The gain of the amplifier 108 is adjusted based on a first gain adjustment signal 124 and a second gain adjustment signal 126. The first gain adjustment signal 124 is generated by a temperature compensation circuit 122 based on a temperature signal 118 that is generated by a temperature sensor 120. The second gain adjustment signal 126 is generated by a stress compensation circuit 132 based both on the temperature signal 118 and on a stress signal 130 that is generated by a stress sensor 128. According to the present example, the Hall effect element 104 is voltage-driven. However, alternative implementations are possible in which the Hall effect element 104 is current driven. In this regard, it will be understood that the present disclosure is not limited to any specific method for driving the Hall effect element.

Figure 1B:
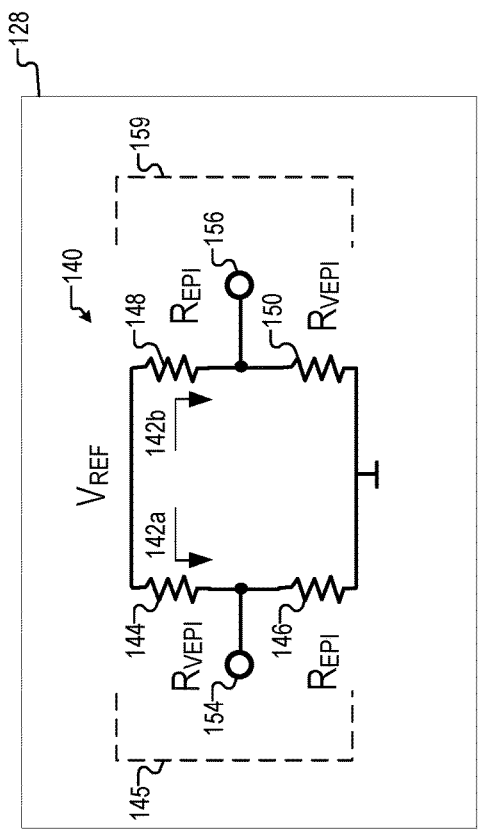
FIG. 1B is a diagram of an example of a bridge circuit that is part of the magnetic field sensor of FIG. 1A, according to aspects of the disclosure.

FIG. 1B shows an example of one possible implementation of the stress sensor 128, according to aspects of the disclosure. As illustrated, the stress sensor 128 can be implemented as a resistor bridge 140 having four resistive elements 144, 146, 148, 150. A first end of the resistor bridge 140 is coupled to a reference voltage ($V_{REF}$) and a second end of the resistor bridge is coupled to a voltage reference (e.g., ground).

In an embodiment, resistive elements may include vertical epitaxial resistors and lateral epitaxial resistors. For example, resistor bridge 140 can include a first set of resistive elements 145 having a first vertical epitaxial resistor 144 and a first lateral epitaxial resistor 146. First vertical epitaxial resistor 144 and first lateral epitaxial resistor 146 may be coupled in series. When coupled in series, all of a first portion 142a of a reference current 142 passes through both first vertical epitaxial resistor 144 and first lateral epitaxial resistor 146. Resistor bridge 140 can include a second set of resistive elements 159 having a second vertical epitaxial resistor 150 and a second lateral epitaxial resistor 148. Second vertical epitaxial resistor 150 and second lateral epitaxial resistor 148 may be coupled in series. When coupled in series, all of a second portion 142b of reference current 142 passes through both second vertical epitaxial resistor 150 and second lateral epitaxial resistor 148.

In an embodiment, first set of resistive elements 145 and second set of resistive elements 159 may be coupled in parallel. When coupled in parallel, at least the first portion 142a of reference current 142 passes through the first set of resistive elements 145 and at least the second portion 142b of reference current 142 passes through the second set of resistive elements 159. A differential signal 154, 156 (i.e., a differential voltage) can be generated between a first terminal and a second terminal of resistor bridge 140. It should be appreciated that the differential signal 154, 156 can have a positive or negative value, depending upon substrate stress experienced by the resistor bridge 140.

Resistor bridge 140 may include two or more different types of resistors (e.g., vertical epitaxial resistor, lateral epitaxial resistor). In other embodiments, resistor bridge 140 may include two resistors, each of different types. In still other embodiments, resistor bridge 140 may include a single resistor. In an embodiment, each of the resistive elements 144, 146, 148, 150 may have the same or substantially similar resistance temperature coefficient. For typical stress and temperature ranges of operation (e.g., 205° C., 70 MPa), a resistance change due to temperature (i.e., a temperature coefficient) is often about three orders of magnitude bigger than resistance change due to stress (i.e., a stress coefficient) of a substrate on which resistive elements 144, 146, 148, 150 are formed, regardless of the type of resistive element used. Thus, small temperature changes can dramatically affect an output of resistor bridge 140 if temperature coefficients are different for one or more resistive elements in resistor bridge 140. However, if temperature coefficients of the four resistors 144, 146, 148, 150 are the same or substantially similar, the differential signal 154, 156 will not change due to the direct effect of temperature.

In an embodiment, values (i.e., resistances) of one or more of the resistors 144, 146, 148, 150 may experience stress changes due to a temperature change (or other stress factors) upon the resistor bridge 140. In some embodiments, the stress changes may be caused by humidity, such as humidity absorption by a housing or packaging (e.g., plastic packaging) that the resistor bridge 140 and/or a Hall effect element are contained within. At a given temperature, if the humidity changes, the housing can absorb moisture and expand and or swell, causing a change in the stress profile seen by the resistor bridge (and/or Hall effect element). Thus, these changes in resistance may cause the differential signal 154, 156 of resistor bridge 140 to change. As will be discussed in greater detail below, changes in differential signal 154, 156 may be used to sense stress of a substrate and compensate for a change in sensitivity of a Hall effect element resulting from the stress of the substrate.

Figure 2A:
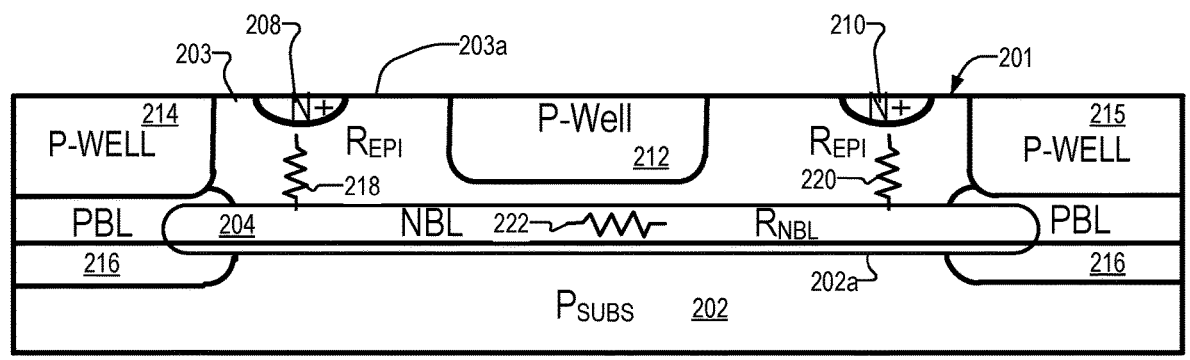
FIG. 2A is cross-sectional view of a semiconductor device implementing the bridge circuit of FIG. 1B, according to aspects of the disclosure.
Figure 2B:
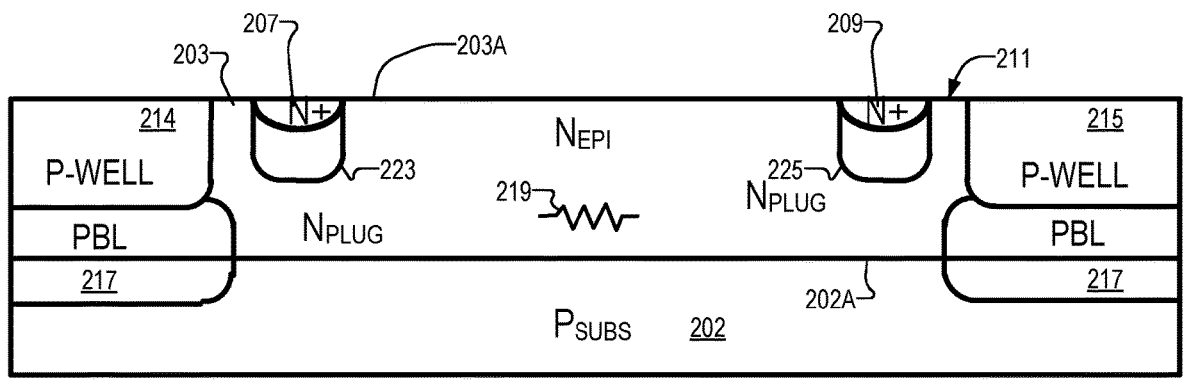
FIG. 2B is another cross-sectional view of the semiconductor device implementing the bridge circuit of FIG. 1B, according to aspects of the disclosure.

FIGS. 2A-B show examples of possible implementations of the resistors 144, 146, 148, 150 of the stress sensor 128, according to aspects of the disclosure. Referring to FIG. 2A, a vertical epitaxial resistor 201 is disposed in an N-type epitaxial layer 203, which is disposed upon P-type semiconductor substrate 202. The substrate 202 has a substrate surface 202a upon which the epitaxial layer 203 is disposed, for example with deposition fabrication techniques. In an embodiment, vertical resistor 201 is the same or substantially similar to first and second vertical epitaxial resistors 144, 150 of FIG. 1B. A PBL region 216 can join with a P-well region 214, forming an electrical barrier to electron flow, the barrier defining a perimeter boundary of the vertical epitaxial resistor 201.

Techniques for deposition and diffusion of the P-well region 216 and the PBL region 214 will be understood. However, let it suffice here to say that the PBL region 217 can be deposited onto the surface 202a of the substrate 202 before the epitaxial layer 203 is deposited upon the surface 202a of the substrate 202. The P-well region 215 can be deposited upon an outer surface 203a of the epitaxial layer 203, along with another P-well region 212. Heating of vertical epitaxial resistor 201 causes the PBL region 216 to diffuse upward into the epitaxial layer 203 and downward into the substrate 202. Heating of the vertical epitaxial resistor 201 also causes the P-well regions 214, 212 to diffuse downward into the epitaxial layer 203. An NBL region 204, formed in a way similar to formation of the PBL region 216, can be deposited onto the surface 202a of the substrate 202 before the epitaxial layer 203 is deposited onto the surface 202a of the substrate 202.

Two (or more) N+ pickups 208, 210 can be deposited and diffused into the surface of the epitaxial layer 203. The pickups 208, 210 can be used to form a two-terminal connection to vertical epitaxial resistor 201, via metal contacts (not shown), formed in a metal layer (not shown), and that are in electrical communication with the pickups 208, 210. The epitaxial layer 203 has resistances 218, 220, between the pickups 208, 210 and the NBL region 204. The P-well region 212 can result in currents that flow through the resistances 218, 220 being directed substantially vertically to the surface 203a of the epitaxial layer 203. It will be understood that a resistance of the resulting vertical epitaxial resistor 201 is dominated by a series sum of the two resistances 218, 220. The resistances 218, 220 have a piezo-resistance coefficient of about $53.4 \times 10^{-11}$ per Pascal due to stress (i.e., stress coefficients) in the x and y directions, and thus, the resistances 218, 222 change value with stresses upon the substrate 202.

Referring now to FIG. 2B, a lateral epitaxial resistor 211 is disposed in an N-type epitaxial layer 203, which is disposed upon P-type semiconductor substrate 202. The substrate 202 has a substrate surface 202a upon which the epitaxial layer 203 is disposed, for example with deposition fabrication techniques. In an embodiment, lateral epitaxial resistor 211 is the same or substantially similar to first and second lateral epitaxial resistors 146, 148 of FIG. 1B. A PBL region 217 can join with a P-well region 215, forming an electrical barrier to electron flow, the barrier defining a perimeter boundary of lateral epitaxial resistor 211.

Techniques for deposition and diffusion of the P-well region 215 and the PBL region 217 will be understood. However, let it suffice here to say that the PBL region 217 can be deposited onto the surface 202a of the substrate 202 before the epitaxial layer 203 is deposited upon the surface 202a of the substrate 202. The P-well region 215 can be deposited upon an outer surface 203a of the epitaxial layer 203. Heating of lateral epitaxial resistor 211 causes the PBL region 217 to diffuse upward into the epitaxial layer 203 and downward into the substrate 202. Heating of lateral epitaxial resistor 211 also causes the P-well regions 215, 214 to diffuse downward into the epitaxial layer 203. Two (or more) N+ pickups 207, 209 and N+ plugs 223, 225 can be deposited and diffused into the surface of the epitaxial layer 203. The pickups 207, 209 and plugs 223, 225 can be used to form a two-terminal connection to lateral epitaxial resistor 211, via metal contacts (not shown), formed in a metal layer (not shown), and that are in electrical communication with the pickups 207, 209 and plugs 223, 225. The epitaxial layer 203 has a resistance 219 between the pickups 207, 209 and the plugs 223, 225.

The P-well region 215 can result in currents that flow through the resistance 219 being directed substantially parallel to the surface 203a of the epitaxial layer 203. First or second lateral epitaxial resistors 146, 148 can be formed by passing the reference current 142 of FIG. 1B between the two pickups 207, 209 and plugs 223, 225. It will be understood that a resistance of the resulting lateral epitaxial resistor 211 is dominated by the value of the resistance 219. The resistance 219 has a piezo-resistance coefficient (i.e., stress coefficient) of about $-24.4 \times 10^{-11}$ per Pascal to stress in the x and y directions, and thus, the resistance 219 changes value with stresses upon the substrate 202.

Figure 3:
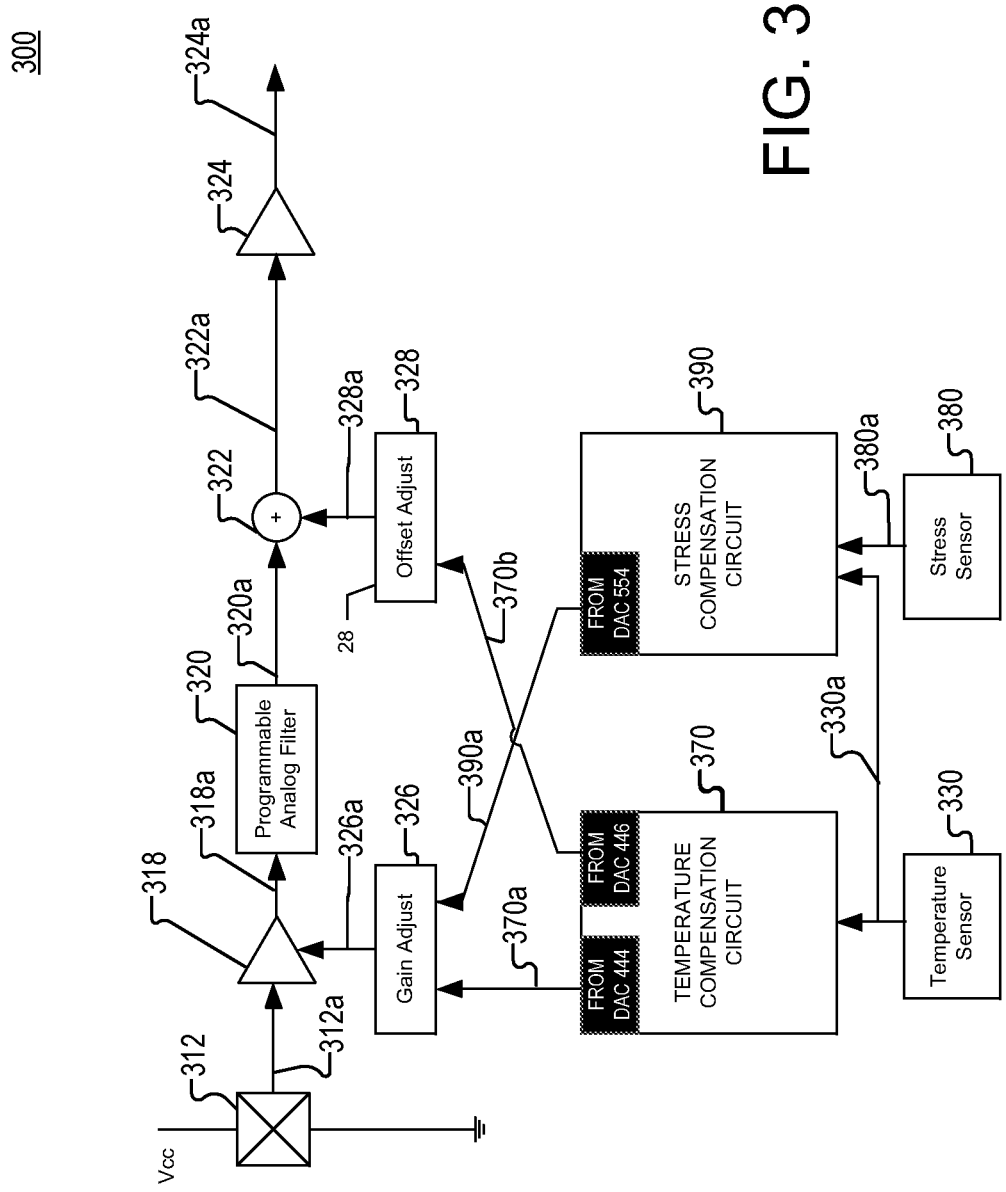
FIG. 3 is a diagram of an example of a magnetic field sensor, according to aspects of the disclosure.

FIG. 3 shows an example of a magnetic field sensor 300, according to aspects of the disclosure. The magnetic field sensor 300 includes a Hall effect element 312, as shown. The Hall effect element 312 is responsive to a magnetic field as may be generated, for example, by a current passing through a current-carrying conductor (not shown) proximate to the Hall effect element 312. The current-carrying conductor can be a part of the magnetic field sensor 300, or it can be external to the magnetic field sensor 300.

The magnetic field sensor 300 includes an analog signal path comprised of an amplifier 318, a filter 320, which can be a programmable filter, a summing circuit 322, and an amplifier 324. The Hall effect element 312 is configured to generate a sensing element signal 312a. As can be readily appreciated, the sensing element signal 312 may be an electrical signal that is generated by the Hall effect element 312 in response to a magnetic field. The amplifier 318 (a gain adjustable analog circuit) is coupled to receive the sensing element signal 312a and to receive a gain control signal 326a from a gain adjust element 326, and to output a gain adjusted signal 318a, as shown. The filter 320 is coupled to receive the gain adjusted signal 318a and configured to generate a filtered signal 320a. The summing circuit 322 (an offset adjustable analog circuit) is coupled to receive the filtered signal 320a and to receive an offset control signal 328a, from an offset adjust element 328, and configured to generate an offset adjusted signal 322a. The amplifier 324 is coupled to receive the offset adjusted signal 322a and configured to generate an output signal 324a having gain and offset correction.

The gain adjust element 326 is configured to receive a first gain adjustment signal 370a and a second gain adjustment signal 390a and generate the gain control signal 326a based on both the first gain adjustment signal 370a and the second gain adjustment signal 390a. In some implementations, the gain adjustment element 326 may generate the gain control signal 326a by summing the first gain adjustment signal 370a and the second gain adjustment signal 390a. However, it will be understood that the present disclosure is not limited to any specific method for generating the gain control signal 326a based on the first gain adjustment signal 370a and the second gain adjustment signal 390a. The offset adjustment element 328 is configured to receive an offset correction signal 370b and generate the offset control signal 328a based on the offset correction signal 370b.

The first gain adjustment signal 370a and the offset correction signal 370b are generated by a temperature compensation circuit 370 based on a temperature signal 330a that is received from a temperature sensor 330. The temperature sensor 330 may include a thermistor and/or any other suitable type of temperature sensor. An example of one possible implementation of the temperature compensation circuit 370 is discussed further below with respect to FIGS. 4A and 4B. The second gain adjustment signal 390a is generated by a stress compensation circuit 390 based on the temperature signal 330a and a stress signal 380a that is provided by a stress sensor 380. The stress sensor 380 may include any suitable type of stress sensor, such as the stress sensor 128, which is discussed above with respect to FIGS. 1A-2B. An example of one possible implementation of the stress compensation circuit 390 is discussed further below with respect to FIGS. 5A-C.

Figure 4A:
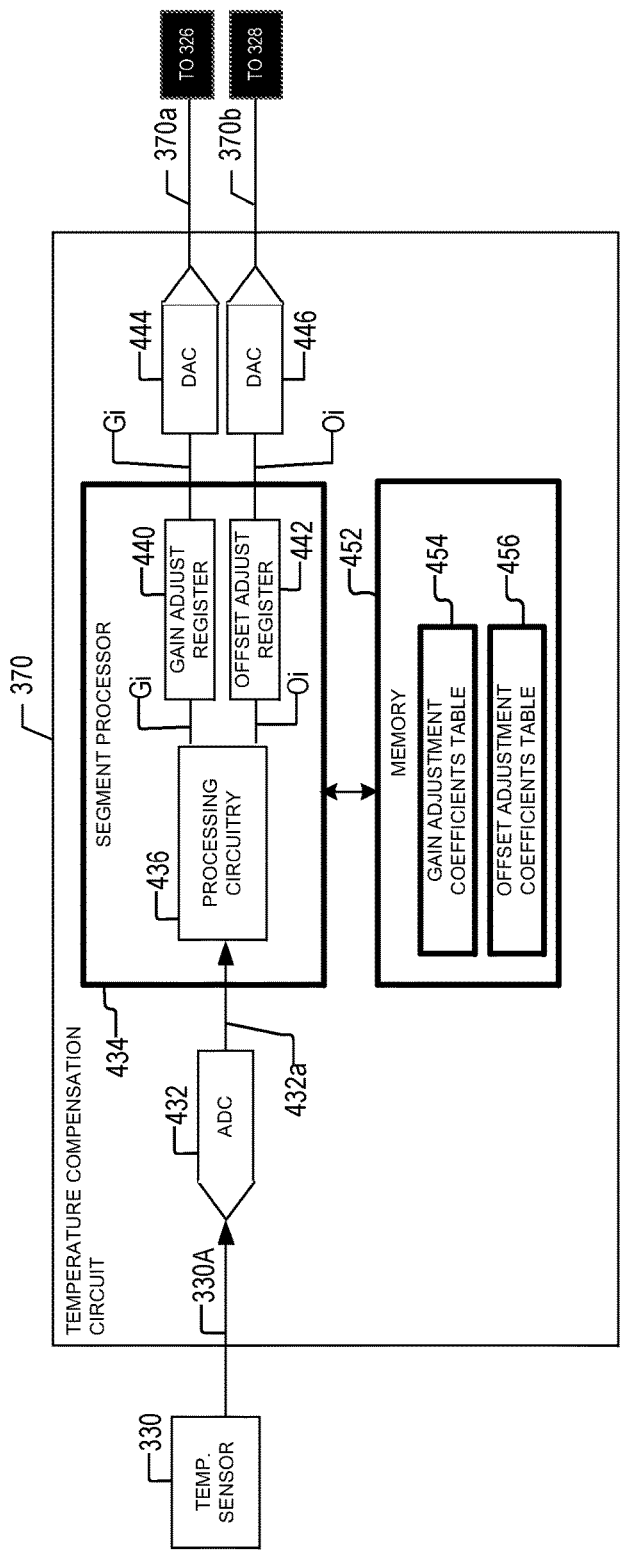
FIG. 4A is a diagram of a temperature compensation circuit that is part of the magnetic field sensor of FIG. 3, according to aspects of the disclosure.

FIG. 4A is a diagram of the temperature compensation circuit 370 of FIG. 3, according to aspects of the disclosure. As illustrated, the temperature compensation circuit 370 may include an analog-to-digital converter (ADC) 432, a segment processor 434, a digital-to-analog converter (DAC) 444, a DAC 446, and a memory 452. The ADC 432 may be arranged to receive the temperature signal 330A from the temperature sensor 330, sample the temperature signal 330a to produce temperature readings 432a, and provide the temperature readings 432a to the segment processor 434. The segment processor 434 may be configured to select or generate a gain adjustment coefficients G based on the temperature readings 432a and stream the gain adjustment coefficients G to the DAC 444. The segment processor 434 may be further configured to select or generate an offset adjustment coefficients O based on the temperature readings 432a and provide the gain adjustment coefficients O to the DAC 446. The DAC 444 may be configured to convert the streamed gain adjustment coefficients G to the first gain adjustment signal 370a, which, as noted above, is used to adjust the gain of the amplifier 318. The DAC 446 may be configured to convert the streamed offset adjustment coefficients O to the offset correction signal 370b, which, as noted above, is used to offset the output of the amplifier 318.

The segment processor 434 may include processing circuitry 436, a gain adjust register 440, and an offset register 442. The processing circuitry 436 may include an application-specific integrated circuit (ASIC), a Field-Programmable Gate Array (FPGA), a hardware processor, and/or any other suitable type of processing circuitry that is configured to implement logic for: (i) generating gain adjustment coefficients G, and (ii) selecting or generating offset adjustment coefficients O. In some implementations, the processing circuitry 436 may be configured to perform the processes 400 A and 400 B, which are discussed further below with respect to FIGS. 4C-D.

Figure 4B:
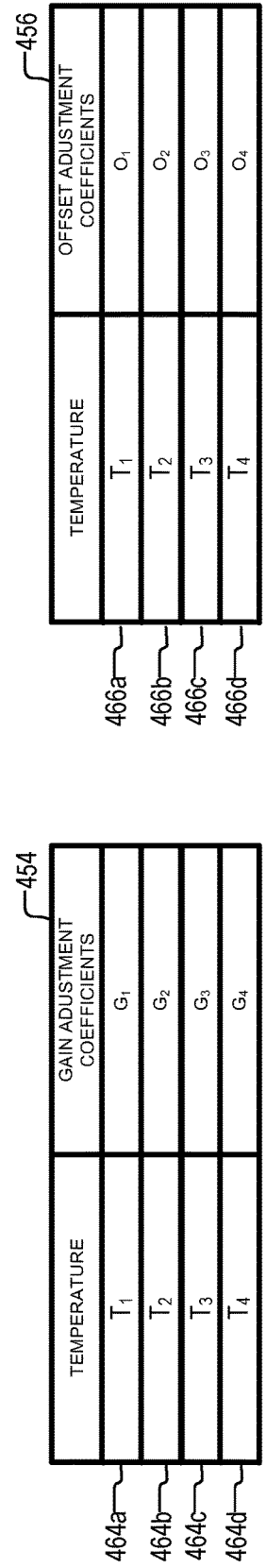
FIG. 4B is a diagram showing an example of gain adjustment coefficients table and an offset adjustment coefficients table that are stored in a memory of the temperature compensation circuit of FIG. 4A, according to aspects of the disclosure.

A memory 452 may include an EEPROM memory and/or any other suitable type of non-volatile memory. The memory 452 can be configured to store a gain adjustment coefficients table 454 and an offset adjustment coefficients table 456. As illustrated in FIG. 4B, table 454 may include a plurality of rows 464. Each of the rows 464 may include a respective temperature value Tx and a gain adjustment coefficient Gx that corresponds to the temperature value Tx. Specifically, row 464a may include a temperature value $T_1$ and a gain adjustment coefficient $G_1$ that corresponds to the temperature value $T_1$; row 464b may include a temperature value $T_2$ and a gain adjustment coefficient $G_2$ that corresponds to the temperature value $T_2$; row 464c may include a temperature value $T_3$ and a gain adjustment coefficient $G_3$ that corresponds to the temperature value $T_3$; and row 464d may include a temperature value $T_4$ and a gain adjustment coefficient $G_4$ that corresponds to the temperature value $T_4$.

Table 456 may include a plurality of rows 466. Each row 466 may include a temperature value Tx and an offset adjustment coefficient Ox that corresponds to the temperature value Tx. Specifically, row 466a may include a temperature value $T_1$ and a gain adjustment coefficient $O_1$ that corresponds to the temperature value $T_1$; row 466b may include a temperature value $T_2$ and a gain adjustment coefficient $O_2$ that corresponds to the temperature value $T_2$; row 466c may include a temperature value $T_3$ and a gain adjustment coefficient $O_3$ that corresponds to the temperature value $T_3$; and row 466d may include a temperature value $T_4$ and a gain adjustment coefficient $O_4$ that corresponds to the temperature value $T_4$. In some embodiments, the gain adjustment coefficients Gx and the offset adjustment coefficients Ox can be measured and stored in conjunction with a factory calibration during manufacture of the magnetic field sensor 300 of FIG. 3. In some alternate embodiments, the DACS 444, 446 are not used and the signals 370a, 370b are in digital format.

Figure 4C:
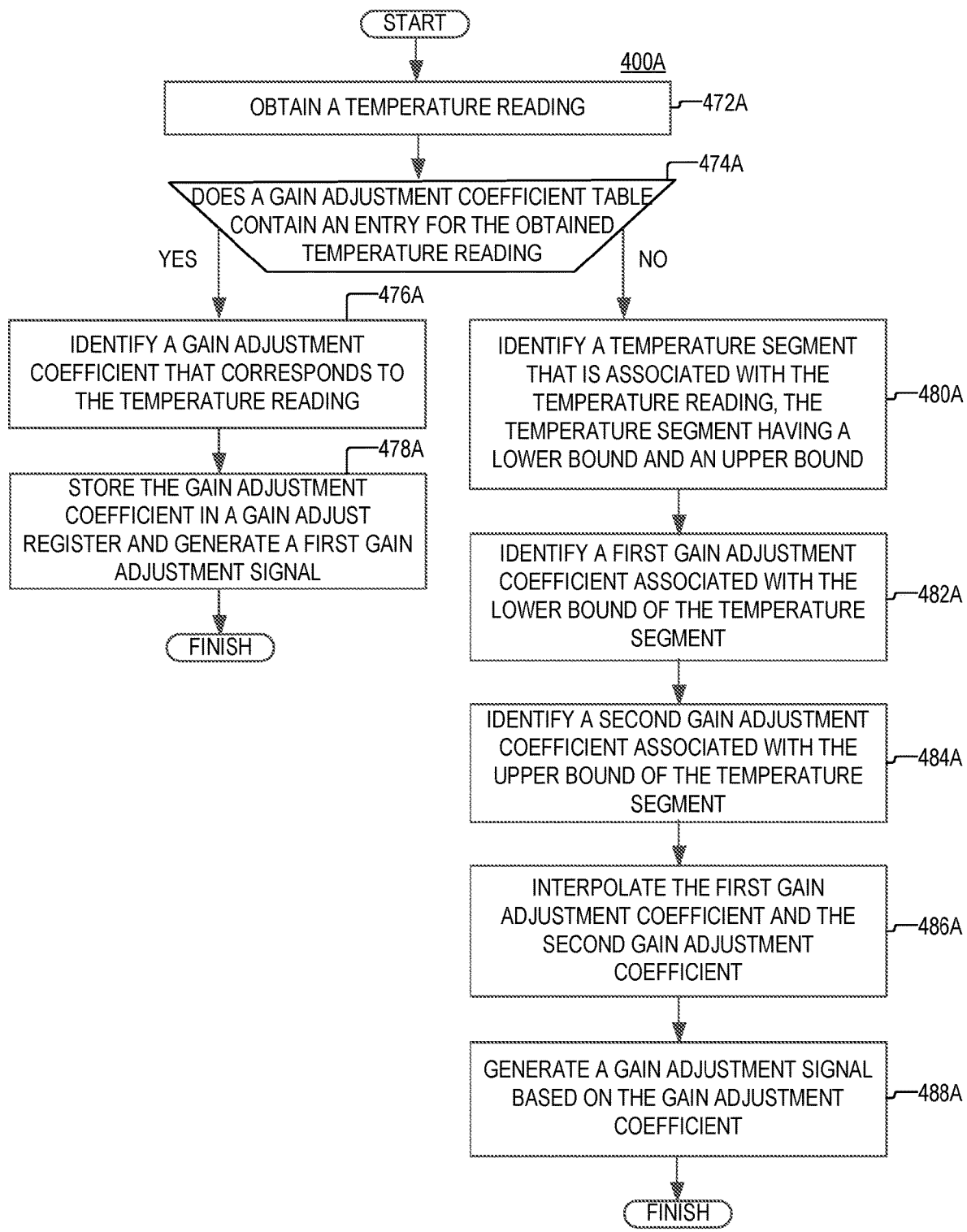
FIG. 4C is a flowchart of an example of a process that is performed by the temperature compensation circuit of FIG. 4A, according to aspects of the disclosure.

FIG. 4C is a flowchart of an example of a process 400a for generating the gain adjustment signal 370a of FIG. 3, according to aspects of the disclosure.

At step 472a, the processing circuitry 436 obtains a temperature reading that is generated using the temperature sensor 330. At step 474a, the processing circuitry 436 performs a search of table 454 based on the temperature reading to determine whether one of the temperature values Tx in table 454 matches the temperature reading that is obtained at step 472a. According to the present example, a temperature value Tx may match the temperature reading when the temperature value Tx is the same as (or within a predetermined distance from) the value of the temperature reading. If one of the temperature values Tx in table 454 matches the temperature reading, the process 400a proceeds to step 476a. Otherwise, if none of the temperature values Tx in table 454 matches the temperature reading, the process 400a proceeds to step 480a.

At step 476a, the processing circuitry 436 retrieves, from table 454, a gain adjustment coefficient Gx that corresponds to the temperature reading. At step 478a, the processing circuitry 436 (together with the DAC 444) generates the first gain adjustment signal 370a based on the retrieved gain adjustment coefficient Gx. In some implementations, the processing circuitry may store the retrieved gain adjustment coefficient Gx in the gain adjust register 440, and the DAC 444 may generate the first gain adjustment signal 370a by retrieving the gain adjustment coefficient Gx from the gain adjust register 440 and converting it to analog format. Although in the present example the gain adjustment coefficient Gx is stored directly into the gain adjust register 440, alternative implementations are possible in which further processing may be performed on the gain adjustment coefficient Gx before the gain adjustment coefficient G is stored in the gain adjust register 440.

At step 480a, the processing circuitry 436 identifies a temperature segment that corresponds to the temperature reading. The temperature segment may include a lower bound and an upper bound. The lower bound of the temperature segment may include the largest value Tx of all values Tx that are listed in table 454, which are smaller than the temperature reading. The upper bound of the temperature segment may include the smallest value Tx of all values Tx that are listed in table 454, which are larger than the temperature reading. In other words, the temperature segment may include the values Tx from table 454 that are the closest to and surround the temperature reading obtained at step 472a, and which define a temperature range (or segment) that includes the temperature reading.

At step 482a, the processing circuitry 436 retrieves, from table 454, a first gain adjustment coefficient Gx that corresponds to the lower bound of the temperature segment. At step 484a, the processing circuitry 436 retrieves, from table 454, a second gain adjustment coefficient Gx that corresponds to the upper bound of the temperature segment. At step 486a, the processing circuitry 436 interpolates the first gain adjustment coefficient Gx and the second gain adjustment coefficient Gx to produce an interpolated gain adjustment coefficient Gi. In some implementations, the interpolation may be performed according to the method discussed in U.S. Pat. No. 8,350,563, which is herein incorporated by reference in its entirety.

At step 488a, the processing circuitry 436 (together with the DAC 444) generates the first gain adjustment signal 370a based on the interpolated gain adjustment coefficient Gi. In some implementations, the processing circuitry 436 may store the interpolated gain adjustment coefficient Gi in the gain adjust register 440, and the DAC 444 may generate the first gain adjustment signal 370a by retrieving the interpolated gain adjustment coefficient Gi from the gain adjust register 440 and converting it to analog format. Although in the present example the interpolated gain adjustment coefficient Gi is stored directly into the gain adjust register 440, alternative implementations are possible in which further processing may be performed on the interpolated gain adjustment coefficient Gi before the gain adjustment coefficient G is stored in the gain adjust register 440.

Figure 4D:
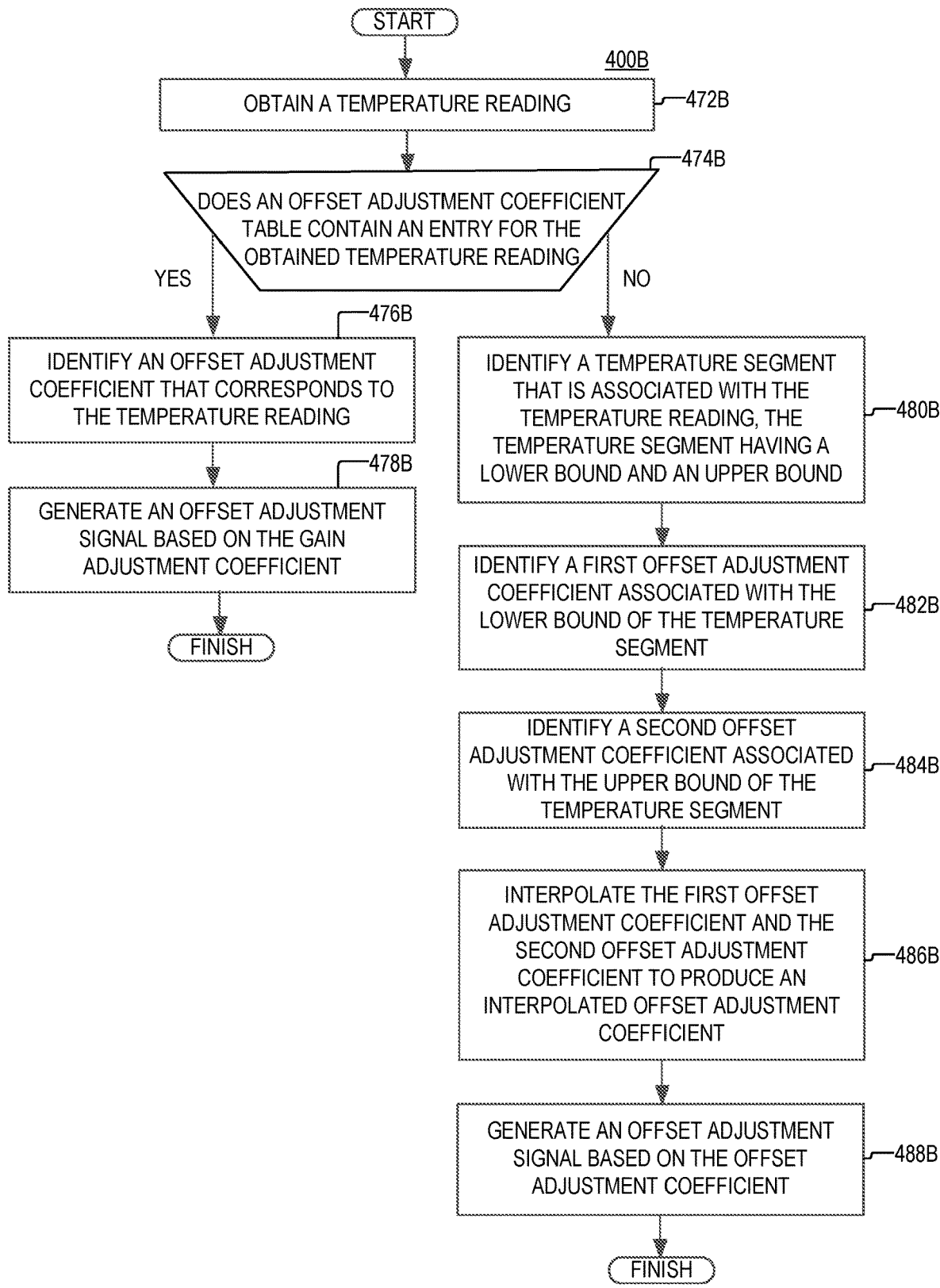
FIG. 4D is a flowchart of an example of a process that is performed by the temperature compensation circuit of FIG. 4A, according to aspects of the disclosure.

FIG. 4D is flowchart of an example of a process 400b for generating offset adjustment signals, according to aspects of the disclosure.

At step 472b, the processing circuitry 436 obtains a temperature reading that is generated by the temperature sensor 330. At step 474b, the processing circuitry 436 performs a search of table 456 based on the temperature reading to determine whether one of the temperature values Tx in table 456 matches the temperature reading that is obtained at step 472b. According to the present example, a temperature value Tx may match the temperature reading when the temperature value Tx is the same as (or within a predetermined distance from) the value of the temperature reading. If one of the temperature values Tx in table 456 matches the temperature reading, the process 400b proceeds to step 476b. Otherwise, if none of the temperature values Tx in table 456 matches the temperature reading, the process 400b proceeds to step 480b.

At step 476b, the processing circuitry 436 retrieves, from table 456, an offset adjustment coefficient Ox that corresponds to the temperature reading. At step 478b, the processing circuitry 436 (together with the DAC 446) generates the offset correction signal 370b based on the retrieved offset adjustment coefficient Ox. In some implementations, the processing circuitry may store the retrieved offset adjustment coefficient Ox in the offset adjust register 442, and the DAC 446 may generate the offset correction signal 370b by retrieving the offset adjustment coefficient Ox from the offset adjust register 442 and converting it to analog format.

At step 480b, the processing circuitry 436 identifies a temperature segment that corresponds to the temperature reading. The temperature segment may include a lower bound and an upper bound. The lower bound of the temperature segment may include the largest value T of all values Tx that are listed in table 456, which are smaller than the temperature reading. The upper bound of the temperature segment may include the smallest value Tx of all values Tx that are listed in table 456, which are larger than the temperature reading. In other words, the temperature segment may include the values T from table 456 that are the closest to and surround the temperature reading obtained at step 472b, and which define a temperature range (or segment) that includes the temperature reading.

At step 482b, processing circuitry 436 retrieves, from table 456, a first offset adjustment coefficient Ox that corresponds to the lower bound of the temperature segment. At step 484b, the processing circuitry 436 retrieves, from table 456, a second offset adjustment coefficient Ox that corresponds to the upper bound of the temperature segment. At step 486b, the processing circuitry 436 interpolates the first offset adjustment coefficient Ox and the second offset adjustment coefficient Ox to produce an interpolated offset adjustment coefficient Oi. In some implementations, the interpolation may be performed according to the method discussed in U.S. Pat. No. 8,350,563, which is herein incorporated by reference in its entirety.

At step 488b, the processing circuitry 436 (together with the DAC 446) generates the offset correction signal 370b based on the interpolated offset adjustment coefficient Oi. In some implementations, the processing circuitry may store the interpolated offset adjustment coefficient Oi in the offset adjust register 442, and the DAC 446 may generate the offset correction signal 370b by retrieving the interpolated offset adjustment coefficient Oi from the offset adjust register 442 and converting it to analog format.

Figures 5A, 5B:
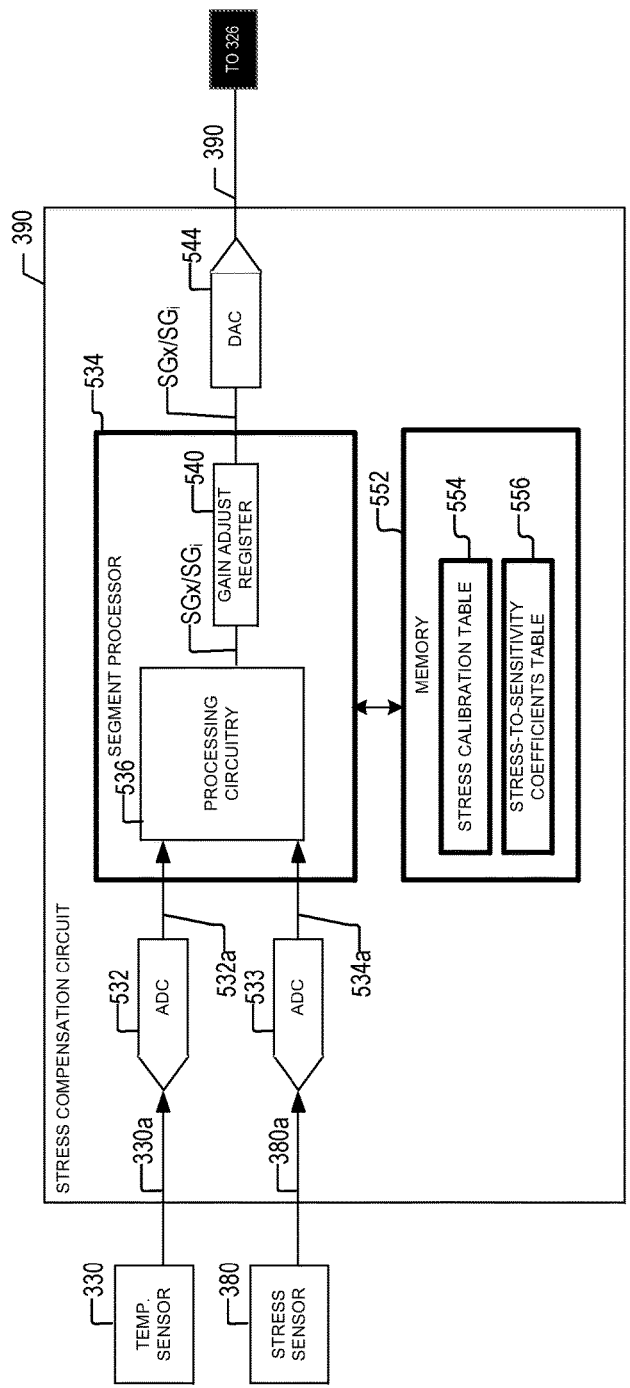
FIG. 5A is a diagram of a stress compensation circuit that is part of the magnetic field sensor of FIG. 3, according to aspects of the disclosure.
FIG. 5B is a diagram showing an example of expected stress table and a gain adjustment table that are stored in a memory of the stress compensation circuit of FIG. 5A, according to aspects of the disclosure.

FIG. 5A is a diagram of the stress compensation circuit 390, according to aspects of the disclosure. As illustrated, the stress compensation circuit 390 may include an ADC 532, an ADC 533, a segment processor 534, a DAC 544, and a memory 552. The ADC 532 may be configured to receive the temperature signal 330a from the temperature sensor 330, sample the temperature signal 330a to produce temperature readings 532a, and provide the temperature readings 532a to the segment processor 534. The ADC 533 may be configured to receive the stress signal 380a from the stress sensor 380, sample the stress signal 380a to produce stress readings 534a, and provide the stress readings 534a to the segment processor 534. The segment processor 534 may be configured to select or generate a gain adjustment signal SG based on the temperature readings 532a and the stress readings 534a, and provide gain adjustment coefficients SG to the DAC 544. The DAC 544 may be configured to convert the gain adjustment coefficients SG to the second gain adjustment signal 390a, which, as noted above, is used to adjust the gain of the amplifier 318.

The segment processor 534 may include processing circuitry 536 and a gain adjust register 540. The processing circuitry 536 may include an application-specific integrated circuit (ASIC), a Field-Programmable Gate Array (FPGA), a hardware processor, and/or any other suitable type of processing circuitry that is configured to implement logic for selecting or generating gain adjustment coefficients SG based on a stress difference. In some implementations, the processing circuitry 536 may be configured to perform the process 500, which is discussed further below with respect to FIG. 5C.

The memory 552 may include an EEPROM memory and/or any other suitable type of non-volatile memory. The memory 552 be configured to store an expected stress table 554 and a gain adjustment coefficients table 556. As illustrated in FIG. 5B, table 554 may include a plurality of rows 564. Each of the rows 564 may include a respective temperature value Tx and an expected stress value Sx. As noted above, the expected stress value Sx for any temperature Tx may identify the stress that the sensor 300 is expected to experience at the temperature Tx. The expected stress value Sx for any temperature Tx may be determined experimentally by exposing the sensor 300 to the temperature Tx and measuring the stress experienced by the sensor 300 at that temperature. Specifically, row 564a may include a temperature value $T_1$ and an expected stress value $S_1$ that identifies the stress which the sensor 300 is expected to experience at the temperature $T_1$; row 564b may include a temperature value $T_2$ and an expected stress value $S_2$ that identifies the stress which the sensor 300 is expected to experience at the temperature $T_2$; row 564c may include a temperature value $T_3$ and an expected stress value $S_3$ that identifies the stress which the sensor 300 is expected to experience at the temperature $T_3$; and row 564d may include a temperature value $T_4$ and an expected stress value $S_4$ that identifies the stress which the sensor 300 is expected to experience at the temperature $T_4$. In some embodiments, the expected stress coefficients Sx can be measured and stored in conjunction with a factory calibration during manufacture of the magnetic field sensor 300 of FIG. 3.

Table 556 may include a plurality of rows 566. Each row 566 may include the value of a respective temperature value T and a corresponding stress-to-sensitivity coefficient K. As is further below, in some implementations, the stress-to-sensitivity coefficient may include any scalar value that is used in calculating a gain adjustment coefficient. Specifically, row 566a may include a temperature $T_1$ and a corresponding stress-to-sensitivity coefficient $K_1$; row 566b may include a temperature $T_2$ and a corresponding stress-to-sensitivity coefficient $K_2$; row 566c may include a temperature $T_3$ and a corresponding stress-to-sensitivity coefficient $K_3$; and row 566d may include a temperature $T_4$ and a corresponding stress-to-sensitivity coefficient $K_4$.

Figure 5C:
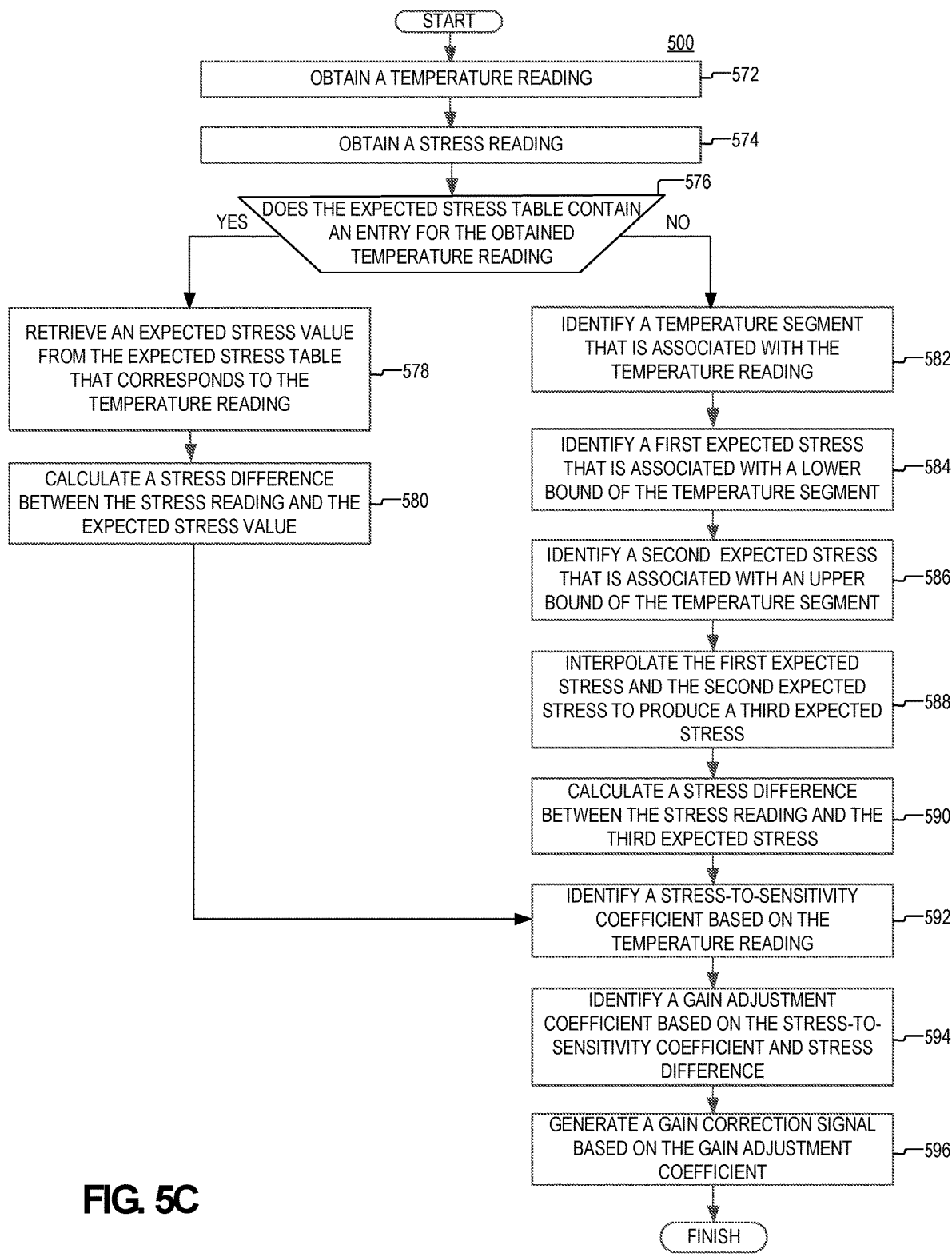
FIG. 5C is a flowchart of an example of a process that is performed by the stress compensation circuit of FIG. 5A, according to aspects of the disclosure.

FIG. 5C is flowchart of an example of a process 500 for generating gain adjustment signals, according to aspects of the disclosure.

At step 572, the processing circuitry 536 obtains a temperature reading that is generated by the temperature sensor 330. At step 574, the processing circuitry 536 obtains a stress reading that is generated by the stress sensor 380. At step 576, the processing circuitry 536 performs a search of table 554 based on the temperature reading to determine whether one of the temperature values Tx in table 554 matches the temperature reading that is obtained at step 572. According to the present example, a temperature value Tx may match the temperature reading when the temperature value Tx is the same as (or within a predetermined distance from) the value of the temperature reading. If one of the temperature values Tx in table 554 matches the temperature reading, the process 500 proceeds to step 578. Otherwise, if none of the temperature values Tx in table 554 matches the temperature reading, the process 500 proceeds to step 582.

At step 578, the processing circuitry 436 retrieves, from table 554 an expected stress value Sx that corresponds to the stress reading. At step 580, the processing circuitry 536 calculates the difference between the expected stress value Sx and the stress reading obtained at step 574, after which the process 500 proceeds to step 592.

At step 582, the processing circuitry 536 identifies a temperature segment that corresponds to the temperature reading. The temperature segment may include a lower bound and an upper bound. The lower bound of the temperature segment may include the largest value Tx of all values Tx that are listed in table 554, which are smaller than the temperature reading. The upper bound of the temperature segment may include the smallest value Tx of all values T that are listed in table 554, which are larger than the temperature reading. In other words, the temperature segment may include the values Tx from table 554 that are the closest to and surround the temperature reading obtained at step 572, and which define a temperature range that includes the temperature reading.

At step 584, the processing circuitry 536 retrieves, from table 554, a first expected stress value Sx that corresponds to the lower bound of the temperature segment. At step 586, the processing circuitry 536 retrieves, from table 554, a second expected stress value Sx that corresponds to the upper bound of the temperature segment. At step 588, the processing circuitry 436 interpolates the first stress value Sx and the second stress value S to produce an interpolated stress value.

At step 590, the processing circuitry 536 calculates a stress difference between the interpolated stress value and the stress reading obtained at step 572. At step 592, the processing circuitry 536 performs a search of table 556 (by using the temperature reading as a search key) and retrieves a stress-to-sensitivity coefficient K that is associated with the temperature reading obtained at step 572. In some implementations, a given stress-to-sensitivity coefficient K may be associated with the temperature reading when the given stress-to-sensitivity coefficient K is stored in the same row 566 with a temperature value T that is the same as (or within a predetermined distance from) the temperature reading that is obtained at step 572. Additionally or alternatively, in some implementations, the stress-to-sensitivity coefficient K may be obtained by interpolation, by: (i) identifying a temperature segment having a lower bound and an upper bound, (ii) identifying a first stress-to-sensitivity coefficient K (based on table 556) that is associated with the lower bound, (iii) identifying a second stress-to-sensitivity coefficient K (based on table 556) that is associated with the upper bound of the stress difference segment, and (iv) interpolating the first and second stress-to-sensitivity coefficients K to produce an interpolated stress-to-sensitivity coefficient K.

At step 594, the processing circuitry 536 calculates a gain adjustment coefficient SG based on the stress difference and the and the stress-to-sensitivity coefficient. In some implementations, the gain adjustment coefficient may be calculated using Equation 1 below:

$$SG = K * \Delta S \quad (1)$$

where, SG is the gain adjustment coefficient, K is the stress-to-sensitivity coefficient calculated at step 592, and ΔS is the stress difference calculated at one of steps 580 or 590.

At step 596, the processing circuitry 536 (together with the DAC 544) generates the second gain adjustment signal 390 based on the retrieved gain adjustment coefficient SGx. In some implementations, the processing circuitry 536 may store the retrieved gain adjustment coefficient SGx in the gain adjust register 540, and the DAC 544 may generate the second gain adjustment signal 390 by retrieving the gain adjustment coefficient SGx from the gain adjust register 540 and converting it to analog format. Although in the present example the gain adjustment coefficient SGx is stored directly into the gain adjust register 540, alternative implementations are possible in which further processing may be performed on the gain adjustment coefficient SG before the gain adjustment coefficient SG is stored in the gain adjust register 540.

In implementations in which the Hall effect element 104 is current-driven, the piezo-Hall effect for the Hall-effect element may be described by Equation 2, below:

$$\frac{\Delta C_1}{C_1} = 45\% \frac{1}{GPa}(s_X + s_Y) \quad (2)$$

where:
$s_x$=stress parallel to the x-axis, $s_y$=stress parallel to the y-axis, C=nominal sensitivity of a planar Hall effect element, and ΔC=change in sensitivity.

Alternatively, in implementations in which the Hall effect element 104 is voltage-driven, the piezo-Hall effect for the Hall-effect element may be described by Equation 3, below:

$$\frac{\Delta C_1}{C_1} = 69\% \frac{1}{GPa}(s_X + s_Y) \quad (3)$$

where:
$s_x$=stress parallel to the x-axis, $s_y$=stress parallel to the y-axis, C=nominal sensitivity of a planar Hall effect element, and ΔC=change in sensitivity.

Thus, a resistor bridge (such as resistor bridge 140 of FIG. 1B) can be configured to sense a change in the stress of a substrate, which is related to a change of sensitivity in Hall effect element 104. In implementations in which the resistor bridge 140 and the Hall effect element 104 are in the same environment (e.g., same packaging, same integrated circuit, same device) a temperature in the environment and/or stresses may impact both the resistor bridge and Hall effect element in a similar fashion. A change in sensitivity of the resistor bridge 140 due to stress of a substrate may mirror a change in sensitivity of Hall effect element 104 due to the same or similar stress. Thus, by measuring a change voltage of the resistor bridge, which is related to a change of stress in a substrate, a related change in sensitivity of Hall effect element can be determined and subsequently used to calculate the gain adjustment coefficients SGx, which are used to compensate the Hall effect element's 104 sensitivity drift. Further information about calculating the sensitivity of the resistor bridge 104 can be found in U.S. Pat. No. 10,107, 8873, entitled "Electronic Circuit for Compensating a Sensitivity Drift of a Hall Effect Element due to Stress," which is herein incorporated by reference in its entirety.

Figure 6:
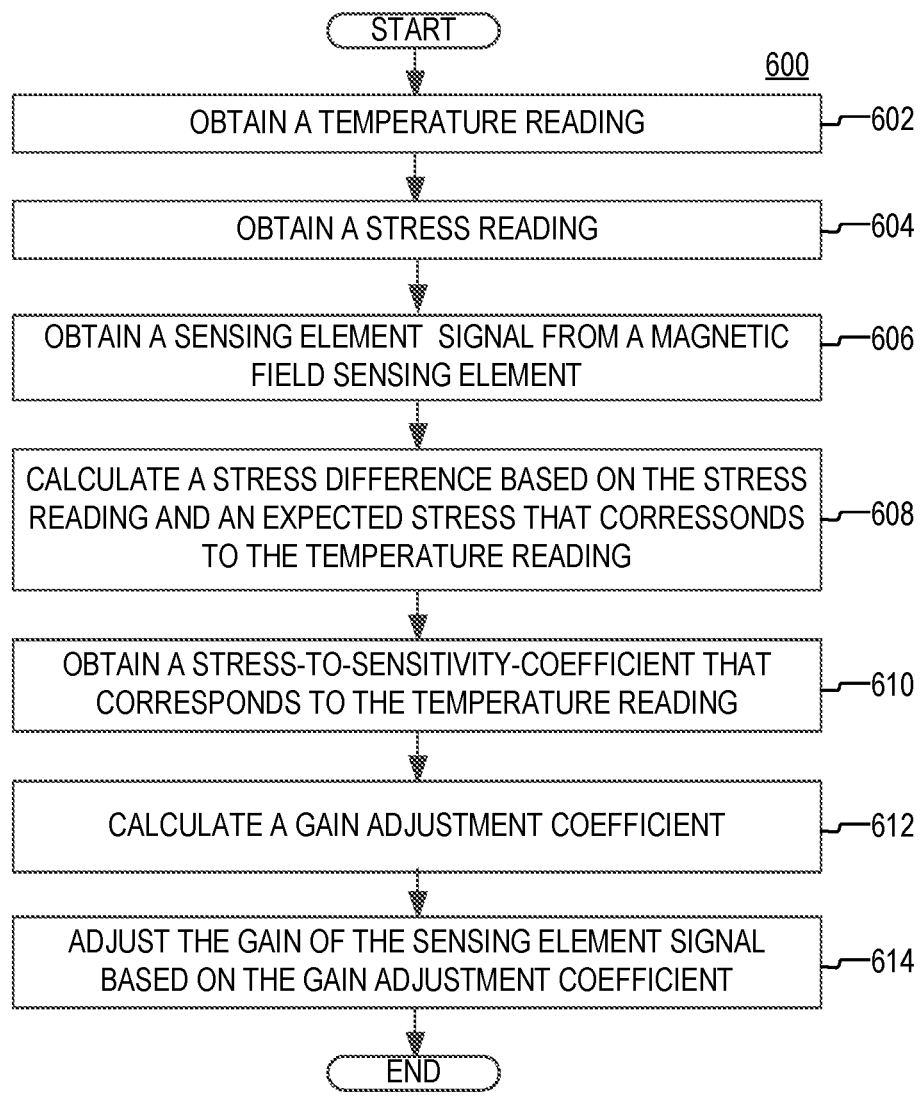
FIG. 6 is a flowchart of an example of a process, according to aspects of the disclosure.

FIG. 6 is a flowchart of an example of a process 600 for adjusting the gain of a sensing element signal. The process 600 may be performed by electronic circuitry that is part of a magnetic field sensor and/or any other suitable type of electronic circuitry. For example, in implementations in which the gain adjustment is performed in the analog domain, the process 600 may be performed by a processor and a gain adjustment circuit. As another example, in implementations in which the gain adjustment is performed in the digital domain, the process 600 may be performed by a processor alone.

At step 602, a temperature reading is obtained from a temperature sensing element. In some implementations, the temperature sensing element may be the same or similar to the temperature sensor 330. At step 604, a stress reading is obtained from a stress sensor. In some implementations, the stress sensor may be the same or similar to the stress sensor 380. At step 606, a sensing element signal is obtained from a magnetic field sensing element. By way of example, in some implementations, the magnetic field sensor may be the same or similar to the Hall effect element 104.

At step 608, a stress difference is calculated. The stress difference may be equal to the difference between the measured stress (i.e., the stress reading obtained at step 604) and an expected stress that is predicted to be experienced by the magnetic field sensor at the measured temperature (i.e., the temperature reading obtained at step 602). In some implementations, the stress difference may be obtained as discussed above with respect to steps 582-590 of the process 500.

At step 610, a stress-to-sensitivity coefficient is obtained based on the temperature reading.

In some implementations, the stress-to-sensitivity coefficient may be obtained based on the temperature reading obtained at step 602. Additionally or alternatively, in some implementations, the stress-to-sensitivity coefficient may be obtained by using a table that maps stress-to-sensitivity coefficients to respective temperature values, as discussed above with respect to step 592 of the process 500.

At step 612, a gain adjustment coefficient is calculated based on the stress difference that is calculated at step 608 and the stress-to-sensitivity coefficient that is calculated at step 610. In some implementations, the gain adjustment coefficient may be calculated based on Equation 1, which is discussed above with the process 500. In some implementations, the gain adjustment coefficient may include any number, string, or alphanumerical string that indicates a change in the gain of the sensing element signal. In some implementations, the gain adjustment coefficient may indicate a level of a signal that is used to drive an amplifier configured to control the gain of the sensing element signal. Additionally or alternatively, in some implementations, the gain adjustment coefficient may include any number, string, or alphanumerical string that is used by a digital filter in adjusting the gain of the sensing element signal. Stated succinctly, the example of FIG. 6 is not limited to any specific implementation of the gain adjustment coefficient.

At step 614, the gain of the sensing element signal is adjusted based on the gain adjustment coefficient. In some implementations, the gain of the sensing element signal may be adjusted in the analog domain. In such implementations, a gain adjustment signal may be generated by a processor and subsequently supplied to an amplifier that is configured to control the gain of the sensing element signal. Alternatively, in some implementations, the gain of the sensing element signal may be adjusted in the digital domain. In such implementations, one or more data samples, that are generated by sampling the sensing element signal, may be modified in a well-known fashion in order to achieve a gain that is indicated by the gain adjustment coefficient.

All references cited herein are hereby incorporated herein by reference in their entirety. Having described preferred embodiments, which serve to illustrate various concepts, structures and techniques, which are the subject of this patent, it will now become apparent that other embodiments incorporating these concepts, structures and techniques may be used. For instance, although, in the present example, processes 400A-B and 500 are performed by different processing circuitry units, alternative implementations are possible in which processes 400A-B and 500 are performed by the same processing unit. Although in the present example, tables 454-456 and 554-556 are stored in different memory units, alternative implementations are possible in which the tables 454, 456, 554, and 556 are stored in the same memory unit. Although in the example of FIGS. 4A and 5A, the segment processors 434 and 534 are depicted as separate processing units, it will be understood that alternative implementations are possible in which the segment processors 434 and 534 are implemented as a single processing unit. Although in the example of FIGS. 4A and 5A, the memory 452 and the memory 552 are depicted as separate memory units, it will be understood that alternative implementations are possible in which the memory 452 and the memory 552 are implemented as a single processing unit. Accordingly, it is submitted that the scope of the patent should not be limited to the described embodiments but rather should be limited only by the spirit and scope of the following claims.

Elements of embodiments described herein may be combined to form other embodiments not specifically set forth above. Various elements, which are described in the context of a single embodiment, may also be provided separately or in any suitable sub combination. Other embodiments not specifically described herein are also within the scope of the following claims.

The invention claimed is:

1. A magnetic field sensor, comprising:
    a stress sensing element;
    a temperature sensing element;
    a magnetic field sensing element that is arranged to generate a sensing element signal;
    a memory configured to store a first table, the first table identifying a plurality of stress-to-sensitivity coefficients, each of the plurality of stress-to-sensitivity coefficients being mapped to a different temperature value; and
    electronic circuitry configured to: obtain a stress reading by using the stress sensing element, obtain a temperature reading by using the temperature sensing element, use the temperature reading and the stress reading to calculate a stress difference, obtain a stress-to-sensitivity coefficient that corresponds to the temperature reading by using the first table, calculate a gain adjustment coefficient based on the stress-to-sensitivity coefficient, and adjust a gain of the sensing element signal based on the gain adjustment coefficient,
    wherein the stress difference includes a difference between an expected stress and the stress reading that is obtained from the stress sensing element.

2. The magnetic field sensor of claim 1, wherein calculating the stress difference includes:
    identifying a temperature segment that corresponds to the temperature reading;
    identifying a first expected stress that corresponds to a lower bound of the temperature segment;
    identifying a second expected stress that corresponds to an upper bound of the temperature segment;
    interpolating the first expected stress and the second expected stress to produce a third expected stress; and
    calculating a difference between the third expected stress and the stress reading.

3. The magnetic field sensor of claim 2, wherein the first expected stress and the second expected stress are identified by searching a second table that is stored in the memory, the second identifying a plurality of temperature-stress pairs, each temperature stress pair including a temperature value and an expected stress that corresponds to the temperature value.

4. The magnetic field sensor of claim 2, wherein the temperature segment is identified based on a plurality of temperature values that are available in a second table that is stored in the memory, the second table identifying a different expected stress for each of the plurality of temperature values.

5. The magnetic field sensor of claim 2, wherein the lower bound of the temperature segment includes a temperature value that is smaller than the temperature reading, and the upper bound of the temperature segment includes a temperature value that is greater than the temperature reading.

6. The magnetic field sensor of claim 1, wherein:
the electronic circuitry includes a processor coupled to a gain adjustable circuit,
the processor is configured to generate a gain correction signal based on the gain adjustment coefficient, and
the gain adjustable circuit is configured to receive: (i) the gain correction signal and (ii) adjust the gain of the sensing element signal based on the gain correction signal.

7. The magnetic field sensor of claim 1, wherein the electronic circuitry includes a processor and the gain of the sensing element signal is adjusted in the digital domain.

8. The magnetic field sensor of claim 1, wherein the magnetic field sensing element includes at least one of a Hall effect element and a magnetoresistive element.

9. A method comprising
obtaining a temperature reading by using a temperature sensing element that is part of a magnetic field sensor;
obtaining a stress reading by using a stress sensing element that is part of the magnetic field sensor;
calculating a stress difference using the temperature reading and the stress reading, the stress difference including a difference between an expected stress that corresponds to the temperature reading and the stress reading obtained from the stress sensing element; and
adjusting a gain of a sensing element signal based on the stress difference, the sensing element signal being generated at least in part by a magnetic field sensing element that is part of the magnetic field sensor.

10. The method of claim 9, wherein adjusting the gain of the sensing element signal includes:
identifying at least one stress-to-sensitivity coefficient based on the temperature reading;
obtaining at least one gain adjustment coefficient based on the stress-to-sensitivity coefficient; and
generating a gain correction signal based on the gain adjustment coefficient and feeding the gain correction signal to a gain adjustable circuit that is arranged to adjust the gain of the sensing element signal.

11. The method of claim 9, wherein calculating the stress difference includes:
identifying a temperature segment that corresponds to the temperature reading;
identifying a first expected stress that corresponds to a lower bound of the temperature segment;
identifying a second expected stress that corresponds to an upper bound of the temperature segment;
interpolating the first expected stress and the second expected stress to produce a third expected stress; and
calculating a difference between the third expected stress and the stress reading.

12. The method of claim 11, wherein the temperature segment is identified based on a plurality of temperature values that are available in an expected stress table, the expected stress table identifying a different expected stress for each of the plurality of temperature values, the expected stress table being stored in a memory of the magnetic field sensor.

13. The method of claim 9, wherein the gain of the sensing element signal is adjusted in the digital domain.

14. The method of claim 9, wherein the magnetic field sensing element includes at least one of a Hall effect element and a magnetoresistive element.

15. A magnetic field sensor, comprising:
a temperature sensing element;
a stress sensing element;
a magnetic field sensing element; and
electronic circuitry configured to perform the operations of:
obtaining a temperature reading by using the temperature sensing element;
obtaining a stress reading by using the stress sensing element;
calculating a stress difference using the temperature reading and the stress reading, the stress difference including a difference between an expected stress that corresponds to the temperature reading and the stress reading obtained from the stress sensing element; and
adjusting a gain of a sensing element signal based on the stress difference, the sensing element signal being generated by the magnetic field sensing element.

16. The magnetic field sensor of claim 15, wherein:
the electronic circuitry includes a processor that is operatively coupled to a gain adjustable circuit, the gain adjustable circuit that is arranged to adjust the gain of the sensing element signal, and
adjusting the gain of the sensing element signal includes:
identifying, by the processor, at least one stress-to-sensitivity coefficient based on the temperature reading;
obtaining, by the processor, at least one gain adjustment coefficient based on the stress-to-sensitivity coefficient; and
generating, by the processor, a gain correction signal based on the gain adjustment coefficient and feeding the gain correction signal to the gain adjustable circuit.

17. The magnetic field sensor of claim 16, wherein the magnetic field sensing element includes at least one of a Hall effect element and a magnetoresistive element.

18. The magnetic field sensor of claim 15, wherein calculating the stress difference includes:
identifying a temperature segment that corresponds to the temperature reading;
identifying a first expected stress that corresponds to a lower bound of the temperature segment;
identifying a second expected stress that corresponds to an upper bound of the temperature segment;
interpolating the first expected stress and the second expected stress to produce a third expected stress; and
calculating a difference between the third expected stress and the stress reading.

19. The magnetic field sensor of claim 18, wherein the temperature segment is identified based on a plurality of temperature values that are available in an expected stress table, the expected stress table identifying a different expected stress for each of the plurality of temperature values, the expected stress table being stored in a memory of the magnetic field sensor.

20. The magnetic field sensor of claim 15, wherein the gain of the sensing element signal is adjusted in the digital domain.

* * * * *

UNITED STATES PATENT AND TRADEMARK OFFICE
CERTIFICATE OF CORRECTION

PATENT NO. : 11,402,280 B2
APPLICATION NO. : 16/538270
DATED : August 2, 2022
INVENTOR(S) : Juan Manuel Cesaretti et al.

It is certified that error appears in the above-identified patent and that said Letters Patent is hereby corrected as shown below:

On the Title Page

Abstract, Line 15 delete "an the" and replace with --on the--.

Abstract, Line 17 delete "grain" and replace with --gain--.

In the Specification

Column 1, Line 14 delete "related an" and replace with --related to an--.

Column 4, Line 62 delete "component" as" and replace with --component" is--.

Column 5, Line 28 delete ", ions)" and replace with --, ions).--.

Column 7, Line 8 delete "current 142" and replace with --current 142 A-B--.

Column 8, Line 9 delete ", vertical resistor" and replace with --, vertical epitaxial resistor--.

Column 8, Lines 15-16 delete "P-well region 216" and replace with --P-well region 214--.

Column 8, Line 16 delete "PBL region 214" and replace with --PBL region 216--.

Column 9, Line 41 delete "signal 312" and replace with --signal 312a--.

Column 11, Line 51 delete "circuitry may" and replace with --circuitry 436 may--.

Column 11, Line 60 delete "G is" and replace with --Gx is--.

Column 12, Line 37 delete "G is" and replace with --Gi is--.

Signed and Sealed this
Thirty-first Day of October, 2023

Katherine Kelly Vidal
*Director of the United States Patent and Trademark Office*

Column 12, Line 63 delete "circuitry may" and replace with --circuitry 436 may--.

Column 13, Line 5 delete "T" and replace with --Tx--.

Column 13, Line 11 delete "T" and replace with --Tx--.

Column 13, Line 31 delete "circuitry may" and replace with --circuitry 436 may--.

Column 14, Line 3 delete "552 be" and replace with --552 may be--.

Column 14, Line 33 delete "further below" and replace with --further indicated below--.

Column 14, Line 43 delete "is flowchart" and replace with --is a flowchart--.

Column 14, Line 62 delete "436" and replace with --536--.

Column 15, Line 8 delete "T" and replace with --Tx--.

Column 15, Line 21 delete "436" and replace with --536--.

Column 15, Line 22 delete "S" and replace with --Sx--.

Column 15, Line 49 delete "the and the stress-to-sensitivity" and replace with --the stress-to-sensitivity--.

Column 15, Line 60 delete "390" and replace with --390a--.

Column 15, Line 64 delete "390" and replace with --390a--.

Column 16, Line 3 delete "SG" and replace with --SGx--.

Column 16, Line 4 delete "SG" and replace with --SGx--.

Column 16, Line 42 delete "change voltage" and replace with --change of voltage--.

Column 16, Line 45 delete "element can" and replace with --element 104 can--.

Column 16, Line 49 delete "bridge 104" and replace with --bridge 140--.

Column 16, Lines 49-50 delete "10, 107, 8873" and replace with --10, 107, 873--.

Column 18, Line 20 delete "sub combination" and replace with --subcombination--.

In the Claims

Column 18, Line 62 delete "second identifying" and replace with --second table identifying--.